(12) United States Patent
Ye et al.

(10) Patent No.: US 9,128,678 B2
(45) Date of Patent: Sep. 8, 2015

(54) CABINET-LEVEL SERVER AND ITS CENTRALIZED POWER SUPPLY SHIELDING STRUCTURE

(71) Applicant: Huawei Technologies Co., Ltd., Shenzhen, Guangdong (CN)

(72) Inventors: Ling Ye, Shenzhen (CN); Hangkong Hu, Shenzhen (CN); Yonghua Xie, Shenzhen (CN); Yangli Dai, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 123 days.

(21) Appl. No.: 13/687,884

(22) Filed: Nov. 28, 2012

(65) Prior Publication Data

US 2013/0088821 A1    Apr. 11, 2013

Related U.S. Application Data

(63) Continuation of application No. PCT/CN2012/071396, filed on Feb. 21, 2012.

(30) Foreign Application Priority Data

Aug. 10, 2011    (CN) .......................... 2011 1 0228366

(51) Int. Cl.
*G06F 1/18* (2006.01)
*G06F 1/26* (2006.01)
(Continued)

(52) U.S. Cl.
CPC ................ *G06F 1/182* (2013.01); *G06F 1/181* (2013.01); *G06F 1/26* (2013.01); *H05K 5/0021* (2013.01); *H05K 7/1492* (2013.01)

(58) Field of Classification Search
CPC ......... H05K 7/14; H05K 5/00; H05K 5/0021; H05K 7/1492; G06F 1/18; G06F 1/26; G06F 1/181; G06F 1/182
USPC .......................... 361/724, 725, 727, 730, 775
See application file for complete search history.

(56) References Cited

U.S. PATENT DOCUMENTS 3,514,671 A     5/1970  Eck et al.
7,461,849 B2 *  12/2008 Robbins et al. ............ 280/47.35
(Continued)

FOREIGN PATENT DOCUMENTS

CN      2060952 U    8/1990
CN      2496216 Y    6/2002
(Continued)

OTHER PUBLICATIONS

1st Office Action in corresponding Chinese Patent Application No. 201110228366.0 (Jul. 2, 2012).
(Continued)

*Primary Examiner* — Jenny L Wagner
*Assistant Examiner* — Ahmad D Barnes
(74) *Attorney, Agent, or Firm* — Leydig, Voit & Mayer, Ltd.

(57) ABSTRACT

The present invention discloses a centralized power supply shielding structure of a cabinet-level server, where the structure includes multiple plug-in frames, a power supply copper bar which is configured to supply power to the multiple plug-in frames, and an inner container shielding can. Multiple plugs of the power supply copper bar are correspondingly inserted into the multiple plug-in frames to supply power to the multiple plug-in frames in a centralized way. The inner container shielding can wraps on a periphery of the power supply copper bar to shield the multiple plug-in frames from the power supply copper bar. The cabinet-level server and its centralized power supply shielding structure of the present invention implement a shielding structure for centralized power supply by a copper bar of integration of a frame and a cabinet, which can be applied in an application scene of an open rack and has a simple structural design.

12 Claims, 6 Drawing Sheets

(51) Int. Cl.
  *H05K 5/00* (2006.01)
  *H05K 7/14* (2006.01)

(56) References Cited

U.S. PATENT DOCUMENTS

| | | | |
|---|---|---|---|
| 2003/0002261 A1* | 1/2003 | Berry et al. | 361/727 |
| 2003/0081386 A1* | 5/2003 | Robillard et al. | 361/724 |
| 2003/0112582 A1 | 6/2003 | Sanders et al. | |
| 2012/0224313 A1* | 9/2012 | Hu et al. | 361/679.4 |
| 2012/0257331 A1* | 10/2012 | Bornhorst et al. | 361/641 |

FOREIGN PATENT DOCUMENTS

| | | |
|---|---|---|
| CN | 2538121 Y | 2/2003 |
| CN | 1547878 A | 11/2004 |
| CN | 2786922 Y | 6/2006 |
| CN | 2817304 Y | 9/2006 |
| CN | 101814753 A | 8/2010 |
| CN | 102141825 A | 8/2011 |
| CN | 102306040 A | 1/2012 |

OTHER PUBLICATIONS $2^{nd}$ Office Action in corresponding Chinese Patent Application No. 201110228366.0 (Dec. 26, 2012).

Search Report in corresponding Chinese Patent Application No. 201110228366.0 (Jun. 20, 2012).

International Search Report in corresponding PCT Patent Application No. PCT/CN2012/071396 (May 17, 2012).

$3^{rd}$ Office Action in corresponding Chinese Patent Application No. 201110228366.0 (May 16, 2013).

* cited by examiner

CABINET-LEVEL SERVER AND ITS CENTRALIZED POWER SUPPLY SHIELDING STRUCTURE

CROSS-REFERENCE TO RELATED APPLICATIONS

This application is a continuation of International Patent Application No. PCT/CN2012/071396, filed on Feb. 21, 2012, which claims priority to Chinese Patent Application No. 201110228366.0, filed on Aug. 10, 2011, both of which are incorporated herein by reference in its entirety.

FIELD OF THE INVENTION

The present invention relates to the field of electronic and communication equipment, and in particular, to a cabinet-level server and a centralized power supply shielding structure.

BACKGROUND OF THE INVENTION

A cabinet-level server, as a main platform of a server and cloud computing, has advantages of energy saving and cost reduction relative to a traditional rack server, while centralized power supply by a copper bar is a main manner for saving energy and reducing cost of the cabinet server.

Adopting the copper bar of the cabinet for centralized power supply in the cabinet-level server easily causes difficulties in EMC (Electro Magnetic Compatibility) shielding design. Power supply by the copper bar of the cabinet-level server is in a pre-research phase in the industry. No mature productized solution exists in the industry for a shielding structure for centralized power supply by the copper bar of the cabinet-level server. The existing shielding method for centralized power supply continues to use a conventional shielding design. The shielding of the centralized power supply copper bar has the following difficulties, especially in an application scene where an open rack is installed, for example, a complicated design (involving adding a shielding material and achieving effective and good overlap joining among multiple separate components in the cabinet, which is difficult to implement).

SUMMARY OF THE INVENTION

Embodiments of the present invention provide a cabinet-level server and its centralized power supply shielding structure, so as to implement a shielding structure for centralized power supply by a copper bar of integration of a frame and a cabinet, which can be applied in an application scene of an open rack and has a simple structural design.

An embodiment of the present invention provides a centralized power supply shielding structure of a cabinet-level server, where the centralized power supply shielding structure of the cabinet-level server includes: multiple plug-in frames, a power supply copper bar which is configured to supply power to the multiple plug-in frames, and an inner container shielding can, where multiple plugs of the power supply copper bar are correspondingly inserted in the multiple plug-in frames to supply power to the multiple plug-in frames in a centralized way; and the inner container shielding can wraps on a periphery of the multiple plug-in frames and/or the power supply copper bar to shield the multiple plug-in frames from the power supply copper bar.

A centralized power supply shielding structure of a cabinet-level server is provided, where the centralized power supply shielding structure of the cabinet-level server includes: one or more plug-in frames, a power supply copper bar which is configured to supply power to the one or more plug-in frames, and an inner container shielding can, where the inner container shielding can wraps on a periphery of the one or more plug-in frames to form a shielding unit and shields the one or more plug-in frames from the power supply copper bar; and holes are opened on the shielding unit at positions corresponding to multiple plugs of the power supply copper bar, and the multiple plugs of the power supply copper bar are correspondingly inserted into the shielding unit through the holes to supply power to the one or more plug-in frames in a centralized way.

An embodiment of the present invention further discloses a cabinet-level server, where the server includes the centralized power supply shielding structure of the foregoing cabinet-level server.

The implementation of the embodiments of the present invention has the following beneficial effects: The inner container shielding can wraps on the periphery of the multiple plug-in frames or the power supply copper bar to shield the multiple plug-in frames from the power supply copper bar, so as to implement the shielding structure for centralized power supply by the copper bar of integration of the frame and the cabinet, which can be applied in the application scene of the open rack and has the simple structural design.

BRIEF DESCRIPTION OF THE DRAWINGS

To illustrate the technical solutions in the embodiments of the present invention or in the prior art more clearly, the accompanying drawings required for describing the embodiments or the prior art are introduced briefly in the following. Apparently, the accompanying drawings in the following description are only some embodiments of the present invention, and persons of ordinary skill in the art can further derive other drawings according to these accompanying drawings without creative efforts.

DETAILED DESCRIPTION OF THE EMBODIMENTS

Figure 1:
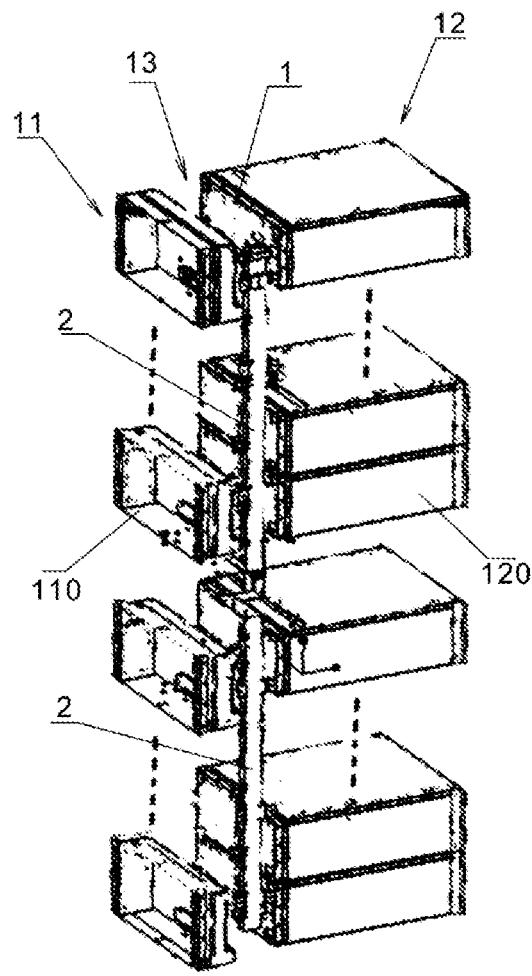
FIG. 1 is a schematic structural diagram of multiple plug-in frames after being assembled of a first embodiment of a centralized power supply shielding structure of a cabinet-level server according to an embodiment of the present invention.
Figure 2:
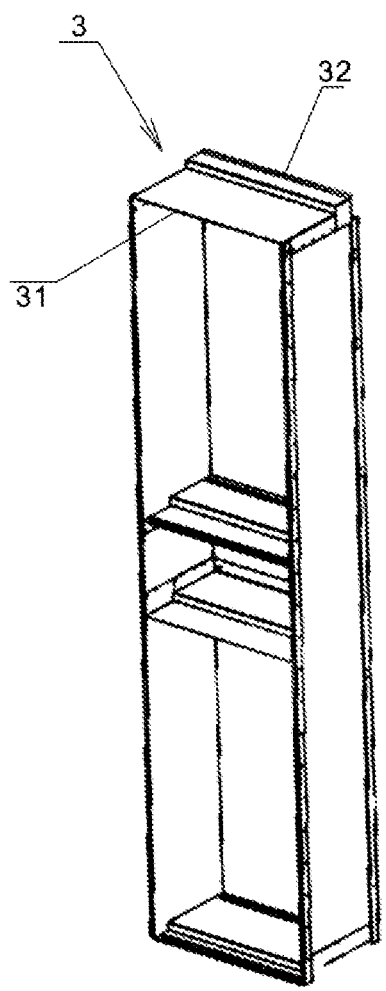
FIG. 2 is a schematic structural diagram of an inner container shielding can of a first embodiment of a centralized power supply shielding structure of a cabinet-level server according to an embodiment of the present invention.
Figure 3:
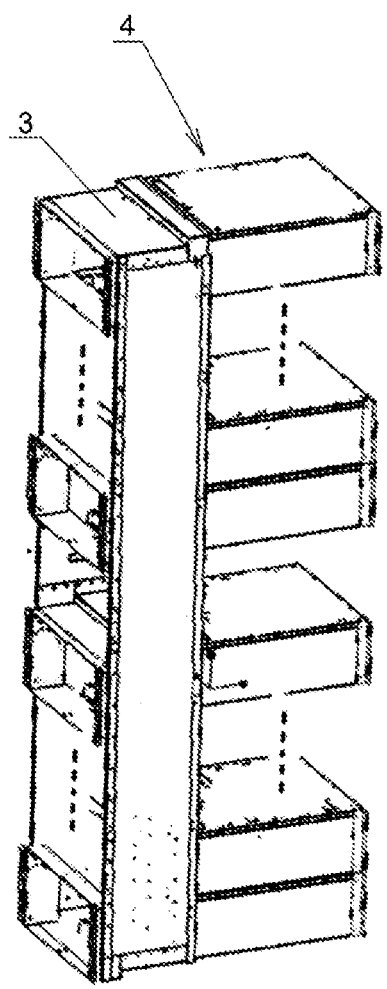
FIG. 3 is a schematic structural diagram of a shielding enclosure of a first embodiment of a centralized power supply shielding structure of a cabinet-level server according to an embodiment of the present invention.
Figure 4:
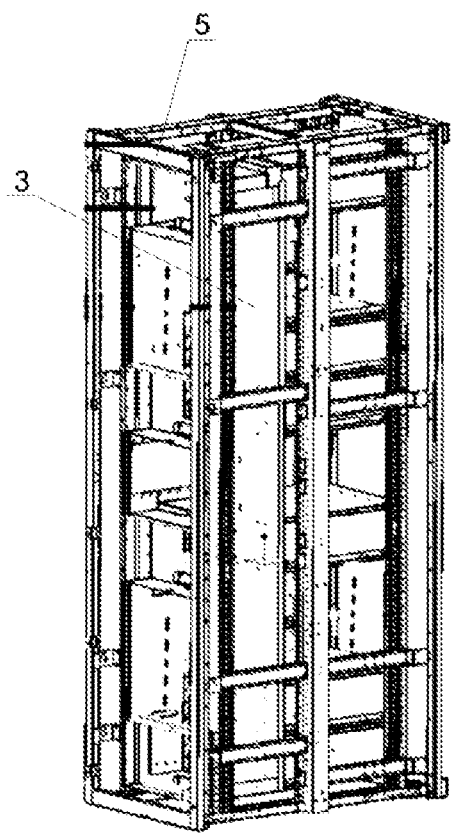
FIG. 4 is a schematic structural diagram of a shielding enclosure and a rack after being assembled of a first embodiment of a centralized power supply shielding structure of a cabinet-level server according to an embodiment of the present invention.

The technical solutions in the embodiments of the present invention are clearly and fully described in the following with reference to the accompanying drawings in the embodiments of the present invention. Apparently, the embodiments to be described are only a part rather than all of the embodiments of the present invention. All other embodiments obtained by persons of ordinary skill in the art based on the embodiments of the present invention without creative efforts shall fall within the protection scope of the present invention.

The implementation of a centralized power supply shielding structure of a cabinet-level server in an embodiment of the present invention includes: multiple plug-in frames 1, a power supply copper bar 2 which is configured to supply power to the multiple plug-in frames, and an inner container shielding can 3. Multiple plugs of the power supply copper bar 2 are correspondingly inserted into the multiple plug-in frames 1 to supply power to the multiple plug-in frames 1 in a centralized way.

The inner container shielding can 3 wraps on a periphery of the power supply copper bar 2 to shield the multiple plug-in frames 1 from the power supply copper bar 2.

The centralized power supply shielding structure of the cabinet-level server in a first embodiment of the present invention, that is, a structure where the inner container shielding can 3 wraps on the periphery of the power supply copper bar 2 to form a shielding enclosure 4, is described in detail in the following. Reference is made to FIG. 1 to FIG. 4.

The plug-in frame 1 is in a square box-shaped structure, and it may be stacked and assembled in a certain sequence to form a whole. In this embodiment, the plug-in frames include front plug-in frames 110 and back plug-in frames 120. The multiple plug-in frames are correspondingly stacked in turn according to positions of the front plug-in frames 110 and the back plug-in frames 120 to form a front plug-in frame group 11 and a back plug-in frame group 12 which have a gap 13 between them. Boards (not shown in the figure) are disposed at opposite ends of the front plug-in frame group 11 and the back plug-in frame group 12. That is to say, in this embodiment, specifications and sizes of the multiple plug-in frames are set to be the same, and the front plug-in frames 110 and the back plug-in frames 120 are a box-shaped structure with a plug on one side and being sealed by a board on an opposite side. A box-shaped front plug-in frame and a box-shaped back plug-in frame are stacked up and down as shown in the figure (the end sides with the boards are set to be opposite). During an assembling process, all sides of each plug-in frame with the front plug-in frames 110 are located at the same side (the left side shown in the figure), and all sides of each plug-in frame with the back plug-in frames 120 are located at the same side (the right side shown in the figure). The multiple plug-in frames arranged as a whole form a narrow rectangular regular assembling body. As shown in the figure, a whole row of the front plug-in frames 110 on the left side form the front plug-in frame group 11, and as shown in the figure, a whole row of the back plug-in frames 120 on the right side form the back plug-in frame group 12. For each plug-in frame, a position of the front plug-in frames 110 is separated from a position of the back plug-in frames 120 by setting, so that a narrow and long gap is formed between the front plug-in frame group 11 and the back plug-in frame group 12 after the assembling of the whole.

The power supply copper bar 2 is a long and thin rod-shaped structure. Multiple connection power supply plugs (not shown in the figure) are arranged equably by setting extending at a surface of one side of the power supply copper bar 2. The function of the power supply copper bar 2 is to be connected to the foregoing multiple plug-in frames 1 to supply power in a centralized way. In this embodiment, the power supply copper bar 2 is accommodated in the gap 13 between the front plug-in frame group 11 and the back plug-in frame group 12.

The inner container shielding can 3 is a hollow can structure with open ends 31 and 32 at two opposite side ends. It may wrap and be disposed on a periphery of the gap 13 which is between the front plug-in frame group 11 and the back plug-in frame group 12 to seal the power supply copper bar 2 in it. In this embodiment, the two opposite open ends 31 and 32 of the inner container shielding can 3 are connected and wraps on peripheries of the two opposite side ends of the front plug-in frame group 11 and the back plug-in frame group 12 respectively to form the shielding enclosure 4.

Preferentially, a shielding material, for example, foam, is disposed at joints between the inner container shielding can 3 and the front plug-in frame group 11, and between the inner container shielding can 3 and the back plug-in frame group 12. A function of the shielding material is to increase a shielding effect, so as to shield the multiple plug-in frames 1 from the power supply copper bar 2.

In specific implementation, first, the foregoing multiple plug-in frames 1 may be stacked up and down according to the positions of the front plug-in frames 110 and the back plug-in frames 120. After the stacking and assembling, the power supply copper bar 2 may be accommodated in the gap 13 between the front plug-in frame group 11 and the back plug-in frame group 12. Finally, the two opposite open ends 31 and 32 of the inner container shielding can 3 are connected and wraps on peripheries of the two opposite side ends of the front plug-in frame group 11 and the back plug-in frame group 12 respectively to form the shielding enclosure 4. Further, the shielding enclosure 4 may be installed in a rack or a cabinet to complete the assembling of a server.

It may be understood that, the plug-in frame may not be limited to the foregoing scene where the front plug-in frames 110 and the back plug-in frames 120 are included, and it may be used as a whole for stacking. While holes (not shown in the figure) may be opened on the multiple plug-in frames 1 at positions corresponding to the multiple plugs of the power supply copper bar 2. The multiple plugs of the power supply copper bar 2 may be placed in the multiple plug-in frames 1 through the holes (not shown in the figure) to be correspondingly inserted into the multiple plug-in frames 1, so as to implement the centralized power supply by the power supply copper bar 2 to the multiple plug-in frames 1. The difference between this implementation manner and the foregoing manner lies in: whether the plug-in frames have an internal space to accommodate the power supply copper bar 2. Adopting a manner of opening holes, a blocking area of the inner container shielding can 3 needs to be enlarged to a certain extent, because before the assembling is completed, the power supply copper bar 2 is exposed on the exterior of the multiple plug-in frames 1 without being shielded with the boards on the plug-in frames 1, and the inner container shielding can 3 needs to be enclosed on entire peripheries of the power supply copper bar 2 to shield the multiple plug-in frames 1 from the power supply copper bar 2.

Figure 5:
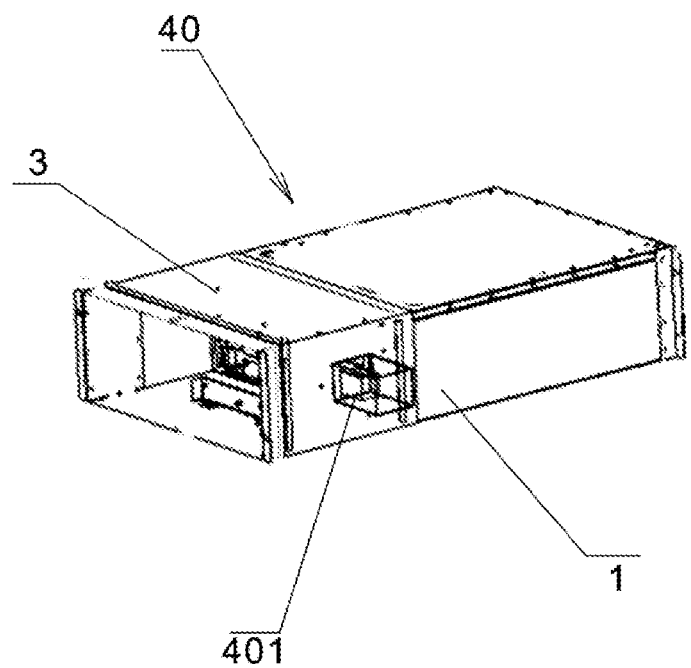
FIG. 5 is a schematic structural diagram of a shielding unit with a single plug-in frame of a second embodiment of a centralized power supply shielding structure of a cabinet-level server according to an embodiment of the present invention.
Figure 6:
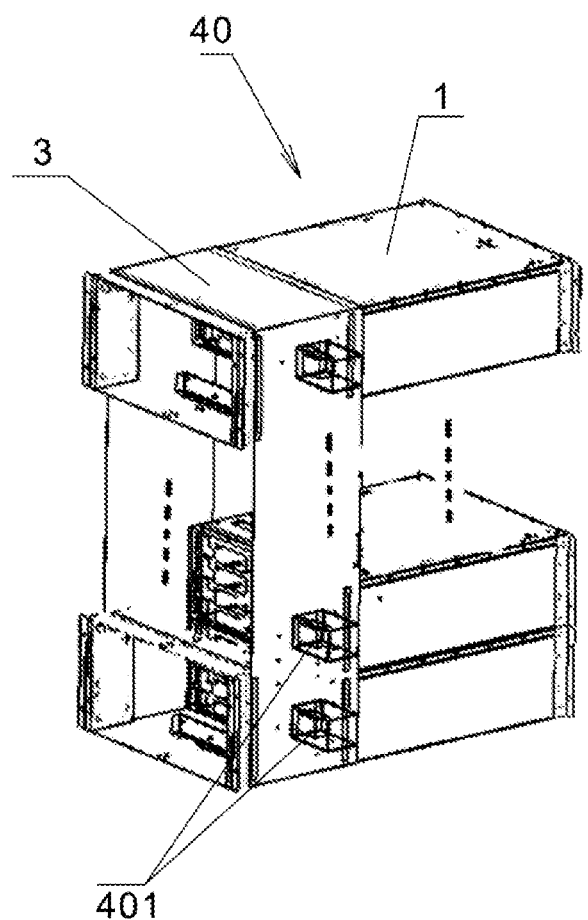
FIG. 6 is a schematic structural diagram of a shielding unit with multiple plug-in frames of a second embodiment of a centralized power supply shielding structure of a cabinet-level server according to an embodiment of the present invention.
Figure 7:
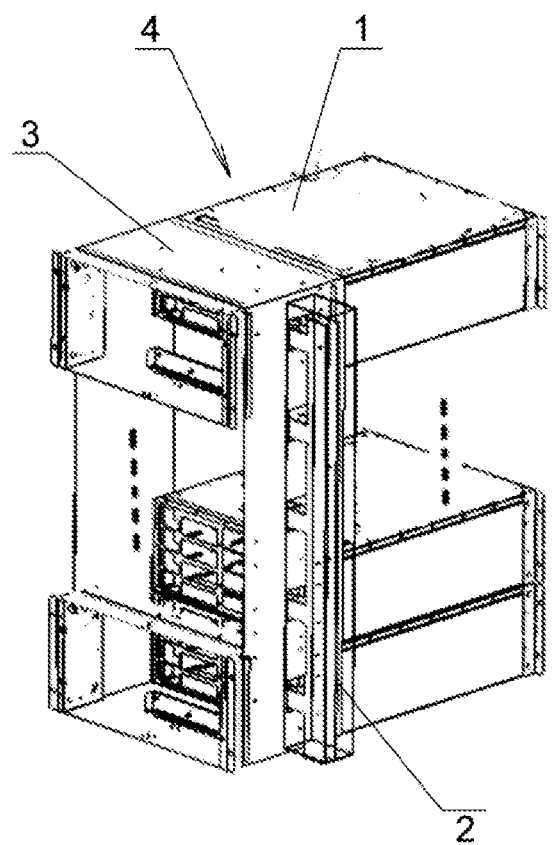
FIG. 7 is a schematic structural diagram of a shielding enclosure of a second embodiment of a centralized power supply shielding structure of a cabinet-level server according to an embodiment of the present invention.

A centralized power supply shielding structure of a cabinet-level server in a second embodiment of the present invention, that is, a structure where an inner container shielding can 3 wraps on a periphery of multiple plug-in frames 1 to form a shielding enclosure 4, is described in detail in the following. Reference is made to FIG. 5 to FIG. 7.

The centralized power supply shielding structure in this implementation manner includes: one or more plug-in frames 1, a power supply copper bar 2 which is configured to supply power to the one or more plug-in frames 1, and an inner container shielding can 3. The inner container shielding can 3 wraps on the periphery of the one or more plug-in frames 1 to form a shielding unit 40 and shields the one or more plug-in frames 1 from the power supply copper bar 2.

Holes 401 are opened on the shielding unit 40 at positions corresponding to multiple plugs of the power supply copper bar 2. The multiple plugs of the power supply copper bar 2 are correspondingly inserted into the shielding unit 40 through the holes 401 to supply power to the one or more plug-in frames 1 in a centralized way.

Preferentially, a shielding material, for example, foam, is disposed at joints between the inner container shielding can 3 and the one or more plug-in frames 1. A function of the shielding material is to increase a shielding effect, so as to shield the multiple plug-in frames 1 from the power supply copper bar 2.

The shielding unit 40 is a box-shaped structure which wraps the inner container shielding can 3, and it is formed by one plug-in frame 1. For example, the inner container shielding can 3 wraps and fixed on the periphery of one plug-in frame (including two scenes where a front plug-in frame and a back plug-in frame are distinguished and where it serves as a whole), one hole 401 may be opened on the inner container shielding can 3 at a position corresponding to a plug of the power supply copper bar 2, and the plug of the power supply copper bar may be correspondingly inserted into the plug-in frame 1 through the hole 401 to supply power to it. In this way, the inner container shielding can shields the shielding unit 40 from the power supply copper bar 2. In specific implementation, the foregoing shielding units 40 which have only one plug-in frame may be stacked, and since each shielding unit has the foregoing hole 401, the multiple plugs of the power supply copper bar 2 may be inserted into the shielding enclosure 4 which is formed by multiple shielding units 40 to supply power to the shielding units 40 in a centralized way.

In another implementation manner, the shielding unit 40 is a tank-shaped structure which wraps the inner container shielding can 3, and it is formed by multiple plug-in frames 1. For example, the inner container shielding can 3 wraps and fixed on the peripheries of multiple plug-in frames (including two scenes where a front plug-in frame and a back plug-in frame are distinguished and it serves as a whole), multiple holes 401 may be opened on the inner container shielding can 3 at positions corresponding to plugs of the power supply copper bar 2, and the plugs of the power supply copper bar 2 may be correspondingly inserted into the multiple plug-in frames 1 inside the shielding unit 40 through the multiple holes 401. In specific implementation, the foregoing shielding unit 40 with multiple plug-in frames may be stacked to form the shielding enclosure 4, and the multiple plugs of the power supply copper bar 2 may be inserted into each shielding unit 40 to supply power to the plug-in frames 1 in it in a centralized way.

The foregoing descriptions are four implementation manners of two embodiments of the centralized power supply shielding structure of the cabinet-level server in the present invention. Definitely, the specific implementation is not limited to the foregoing implementation manners, as long as the inner container shielding can 3 wraps on the periphery of the multiple plug-in frames 1 or the power supply copper bar 2 to shield the multiple plug-in frames 1 from the power supply copper bar 2.

The present invention further discloses a cabinet-level server, where the server includes a rack 5 or a cabinet (not shown in the figure) and includes the foregoing centralized power supply shielding structure of the cabinet-level server. In specific implementation, the foregoing assembled shielding enclosure 4 may be directly assembled on the rack 5 which is overlapping joined by multiple frames. Although the rack 5 is an open space (a front door, a back door, and a side door may not be disposed), the inner container shielding can 3 wraps on the periphery of the multiple plug-in frames 1 or the power supply copper bar 2 to shield the multiple plug-in frames 1 from the power supply copper bar 2 so as to implement overall shielding. Definitely, the foregoing centralized power supply shielding structure may also be disposed in a cabinet without installing any shielding material in the cabinet, so as to implement the installation of a non-shielding cabinet.

In the cabinet-level server and its centralized power supply shielding structure in the embodiments of the present invention, the inner container shielding can wraps on the periphery of the multiple plug-in frames or the power supply copper bar to shield the multiple plug-in frames from the power supply copper bar, so as to implement a shielding structure for centralized power supply by a copper bar of integration of the frame and the cabinet, which can be applied in an application scene of an open rack, and has a simple structural design and a low cost.

What is claimed is:

1. A centralized power supply shielding structure of a cabinet-level server, comprising:
multiple plug-in frames,
a power supply copper bar configured to supply power to the multiple plug-in frames, and an inner container shielding can,
wherein multiple plugs of the power supply copper bar are correspondingly inserted into the multiple plug-in frames to supply power to the multiple plug-in frames in a centralized way; and
the inner container shielding can wraps on a periphery of the power supply copper bar to shield the multiple plug-in frames from the power supply copper bar;
wherein the multiple plug-in frames comprise front plug-in frames and back plug-in frames, the multiple plug-in frames are stacked to form a front plug-in frame group and a back plug-in frame group which have a gap between them, and boards are disposed at opposite ends of the front plug-in frame group and the back plug-in frame group;
the power supply copper bar is accommodated in the gap between the front plug-in frame group and the back plug-in frame group; and
the inner container shielding can wraps and is disposed on a periphery of the gap between the front plug-in frame group and the back plug-in frame group to seal the power supply copper bar in the inner container shielding can.

2. The centralized power supply shielding structure of the cabinet-level server according to claim 1, wherein the inner container shielding can is a hollow cubic structure which have openings at two opposite side ends; and the two opposite open ends of the inner container shielding can are connected and wrap on peripheries of the two opposite side ends of the front plug-in frame group and the back plug-in frame group respectively to form a shielding enclosure.

3. The centralized power supply shielding structure of the cabinet-level server according to claim 2, wherein a shielding material is disposed at joints between the inner container shielding can and the front plug-in frame group, and between the inner container shielding can and the back plug-in frame group.

4. The centralized power supply shielding structure of the cabinet-level server according to claim 1, wherein holes are opened on the multiple plug-in frames at positions corresponding to the multiple plugs of the power supply copper bar, and the multiple plugs of the power supply copper bar are correspondingly inserted into the multiple plug-in frames through the holes; and the inner container shielding can encloses on a periphery of the power supply copper bar and the multiple plug-in frames to shield the multiple plug-in frames from the power supply copper bar.

5. A centralized power supply shielding structure of a cabinet-level server, comprising:

one or more plug-in frames, a power supply copper bar configured to supply power to the one or more plug-in frames, and an inner container shielding can, wherein the inner container shielding can wraps on a periphery of the one or more plug-in frames to form a shielding unit and shields the one or more plug-in frames from the power supply copper bar; and holes are opened on the shielding unit at positions corresponding to multiple plugs of the power supply copper bar, and the multiple plugs of the power supply copper bar are correspondingly inserted into the shielding unit through the holes to supply power to the one or more plug-in frames in a centralized way;

wherein the one or more plug-in frames comprise front plug-in frames and back plug-in frames, the multiple plug-in frames are stacked to form a front plug-in frame group and a back plug-in frame group which have a gap between them, and boards are disposed at opposite ends of the front plug-in frame group and the back plug-in frame group;

the power supply copper bar is accommodated in the gap between the front plug-in frame group and the back plug-in frame group; and the inner container shielding can wraps and is disposed on a periphery of the gap between the front plug-in frame group and the back plug-in frame group to seal the power supply copper bar in the inner container shielding can.

6. The centralized power supply shielding structure of the cabinet-level server according to claim 5, wherein a shielding material is disposed at joints between the inner container shielding can and the one or more plug-in frames.

7. The centralized power supply shielding structure of the cabinet-level server according to claim 6, wherein multiple shielding units are stacked to form a shielding enclosure; and the multiple plugs of the power supply copper bar are inserted into the shielding enclosure to supply power to the shielding units in the centralized way.

8. The centralized power supply shielding structure of the cabinet-level server according to claim 5, wherein multiple shielding units are stacked to form a shielding enclosure; and the multiple plugs of the power supply copper bar are inserted into the shielding enclosure to supply power to the shielding units in the centralized way.

9. A cabinet-level server, comprising a rack or a cabinet, wherein the cabinet-level server comprises a centralized power supply shielding structure of the cabinet-level server, and the centralized power supply shielding structure is assembled on the rack or the cabinet;

wherein the centralized power supply shielding structure of the cabinet-level server comprises:

multiple plug-in frames, a power supply copper bar configured to supply power to the multiple plug-in frames, and an inner container shielding can, wherein multiple plugs of the power supply copper bar are correspondingly inserted into the multiple plug-in frames to supply power to the multiple plug-in frames in a centralized way; and the inner container shielding can wraps on a periphery of the power supply copper bar to shield the multiple plug-in frames from the power supply copper bar;

wherein the plug-in frames comprise front plug-in frames and back plug-in frames, the multiple plug-in frames are stacked to form a front plug-in frame group and a back plug-in frame group which have a gap between them, and boards are disposed at opposite ends of the front plug-in frame group and the back plug-in frame group;

the power supply copper bar is accommodated in the gap between the front plug-in frame group and the back plug-in frame group; and the inner container shielding can wraps and is disposed on a periphery of the gap between the front plug-in frame group and the back plug-in frame group to seal the power supply copper bar in the inner container shielding can.

10. The cabinet-level server according to claim 9, wherein the inner container shielding can is a hollow cubic structure which have openings at two opposite side ends; and the two opposite open ends of the inner container shielding can are connected and wrap on peripheries of the two opposite side ends of the front plug-in frame group and the back plug-in frame group respectively to form a shielding enclosure.

11. The cabinet-level server according to claim 10, wherein a shielding material is disposed at joints between the inner container shielding can and the front plug-in frame group, and between the inner container shielding can and the back plug-in frame group.

12. The cabinet-level server according to claim 9, wherein holes are opened on the multiple plug-in frames at positions corresponding to the multiple plugs of the power supply copper bar, and the multiple plugs of the power supply copper bar are correspondingly inserted into the multiple plug-in frames through the holes; and the inner container shielding can encloses on a periphery of the power supply copper bar and the multiple plug-in frames to shield the multiple plug-in frames from the power supply copper bar.

* * * * *